United States Patent [19]
Mottahed

[11] Patent Number: 5,565,656
[45] Date of Patent: Oct. 15, 1996

[54] SELF-FASTENING EMI SHIELDING ENCLOSURES

[75] Inventor: Behzad D. Mottahed, Upper Montclair, N.J.

[73] Assignee: Lucent Technologies Inc., Murray Hill, N.J.

[21] Appl. No.: 346,666

[22] Filed: Nov. 30, 1994

[51] Int. Cl.$^6$ ....................................................... H05K 9/00
[52] U.S. Cl. ...................................... 174/35 GC; 361/818
[58] Field of Search ............................ 174/35 R, 35 MS, 174/35 GC; 361/816, 818

[56] References Cited

U.S. PATENT DOCUMENTS

| | | | |
|---|---|---|---|
| 4,830,182 | 5/1989 | Nakazato et al. | 206/334 |
| 4,977,483 | 12/1990 | Perretta | 206/328 X |
| 5,107,404 | 4/1992 | Tam | 361/424 |
| 5,170,009 | 12/1992 | Kadokura | 174/35 R |
| 5,339,222 | 8/1994 | Simmons et al. | 361/818 |
| 5,353,201 | 10/1994 | Maeda | 361/816 |
| 5,354,951 | 10/1994 | Lange, Sr. et al. | 174/35 R |
| 5,386,340 | 1/1995 | Kurz | 361/737 |
| 5,438,482 | 8/1995 | Nakamura et al. | 361/816 |

*Primary Examiner*—Laura Thomas
*Assistant Examiner*—Christopher Horgan
*Attorney, Agent, or Firm*—Margaret A. Burke; Lester H. Birnbaum

[57] ABSTRACT

The present invention provides enclosures for protecting equipment, particularly electrical equipment, from electromagnetic interference. The enclosure includes at least two EMI-shielding portions which, when assembled, at least partially enclose a piece of equipment to be shielded. The first EMI-shielding portion of the enclosure is provided with a first interlocking element. The first interlocking element is integrally formed with the first EMI-shielding portion. A second EMI-shielding portion of the enclosure includes a second integrally-formed interlocking element. The first and second interlocking elements connect the first and second EMI-shielding portions of the enclosure such that electromagnetic energy is not transferred through the connected first and second interlocking elements at a substantially greater rate than through the remaining portions of the enclosure. In this manner, a self-fastening EMI-shielding enclosure is obtained which houses equipment without the need for added mechanical fastening elements, such as screws and bolts.

16 Claims, 9 Drawing Sheets

FIG. 6
FIG. 7
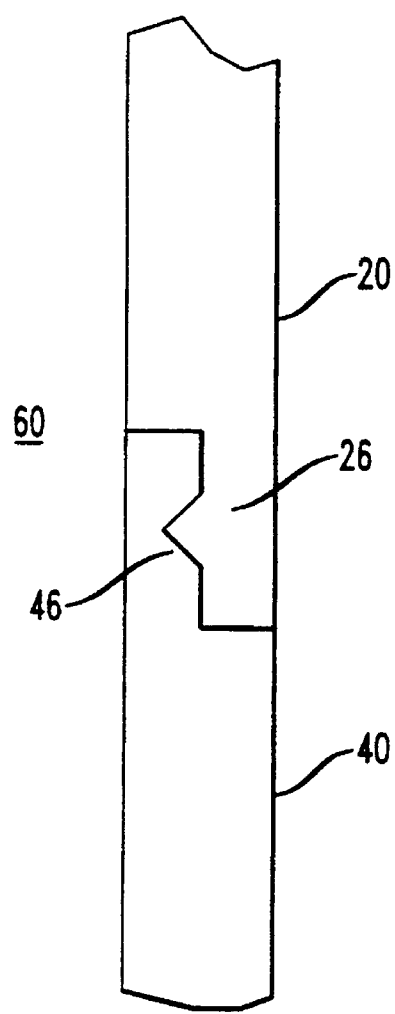
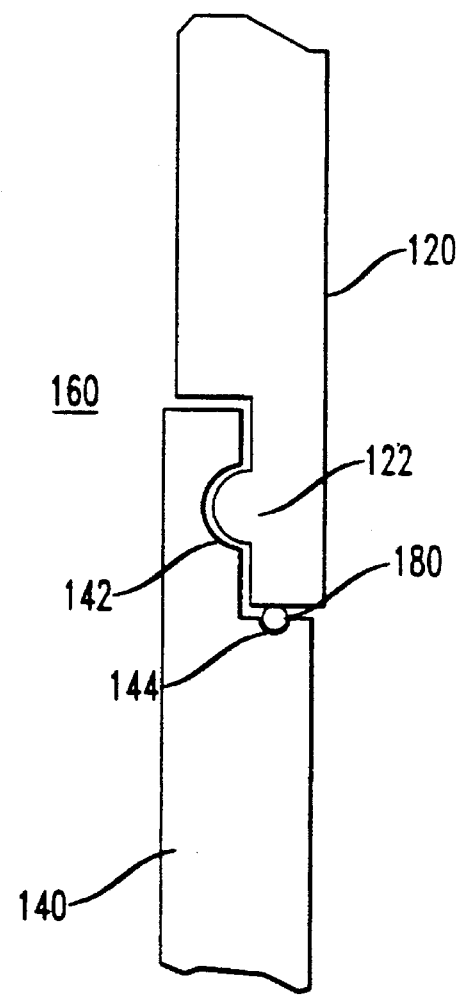

FIG. 8
FIG. 9
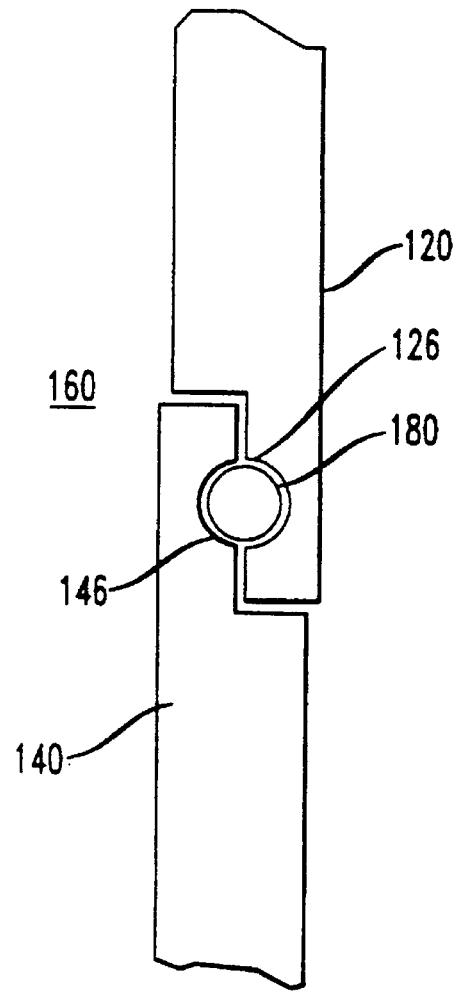
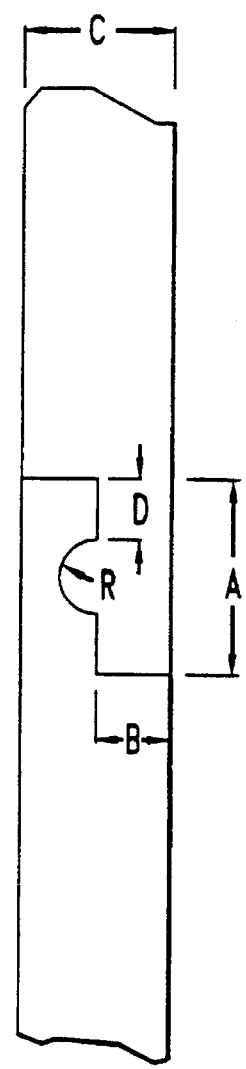

SELF-FASTENING EMI SHIELDING ENCLOSURES

FIELD OF THE INVENTION

The invention relates to EMI shielding and, more particularly, to self-fastening EMI shielding enclosures for protecting sensitive electrical equipment.

BACKGROUND OF THE INVENTION

Numerous electrical components are sensitive to electromagnetic fields. Electrical equipment that operates at radio frequencies is especially sensitive to electromagnetic interference (EMI) from external radio frequency (r.f.) fields. Sensitive equipment is typically housed in an enclosure which shields the equipment from extraneous signals. In addition to equipment which must be protected from external fields, electrical apparatus which produce r.f. signals can also require shielding. Such apparatus can leak r.f., by radiation or conduction, impairing the performance of surrounding devices.

Electromagnetic shielding enclosures are typically fabricated from material which either predominantly reflects or absorbs incident r.f. radiation. Metals such as aluminum reflect r.f., while carbon and/or metal loaded polymers absorb r.f. radiation. Such enclosures vary in size and shape, depending upon the equipment they are designed to house. In order to install the equipment, one or more openings are provided in the enclosures. Tight sealing must be provided around these openings in order to prevent r.f. penetration through gaps. Small gaps act as antennas through which r.f. radiation is transmitted. Generally, the openings are sealed with mechanical fastening members. Threaded fasteners, such as screws, are used as sealing members for numerous r.f. enclosures. While threaded fasteners permit ready access to the equipment inside, they are time-consuming and costly to install. Additionally, it is difficult to ensure a low impedance contact along the joint interface between adjacent fasteners for the lifespan of the seal. As the fasteners are removed and replaced to service the housed equipment, the seal can be degraded, causing gaps which transmit radiation. To prevent leakage, mechanical fasteners must be precisely spaced, the inter-fastener spacing being determined by the necessary degree of attenuation.

For very high attenuation requirements, sealing gaskets are provided around the opening in the space between the joining surfaces. Gaskets help ensure high attenuation since they fill any gaps or surface irregularities. Such gaskets are difficult and expensive to install, and must be replaced each time the r.f. enclosure is opened. Further description of conventional r.f. shielding is described in Hickman, *Newnes Practical R. F. Handbook,* (Newnes, Butterworth-Heineman, Ltd., Oxford), c. 1993, the disclosure of which is incorporated herein by reference.

Thus, there is a need in the art for improved EMI shielding. In particular, there is a need for improved EMI shielding which permits ready access to equipment housed in an enclosure without the need for removing and replacing numerous mechanical fasteners.

SUMMARY OF THE INVENTION

The present invention provides enclosures for protecting equipment, particularly electrical equipment, from electromagnetic interference. The enclosure includes at least two EMI-shielding portions which, when assembled, at least partially enclose a piece of equipment to be shielded. The first EMI-shielding portion of the enclosure is provided with a first interlocking element. The first interlocking element is integrally formed with the first EMI-shielding portion. A second EMI-shielding portion of the enclosure includes a second integrally-formed interlocking element. The first and second interlocking elements connect the first and second EMI-shielding portions of the enclosure such that electromagnetic energy is not transferred through the connected first and second interlocking elements at a substantially greater rate than through the remaining portions of the enclosure. In this manner, a self-fastening EMI-shielding enclosure is obtained which houses equipment without the need for added mechanical fastening elements, such as screws and bolts.

In another aspect, the present invention provides an enclosure for shielding apparatus from electromagnetic interference comprising a first r.f.-shielding housing member having at least a first integrally-formed engagement surface. A second r.f.-shielding housing member is configured to connect with the first r.f.-shielding housing member to form at least a portion of the enclosure. The second r.f.-shielding housing member has an integrally formed engagement surface configured to interengage with the first engagement surface over at least 85% of the combined area of the first and second engagement surfaces.

BRIEF DESCRIPTION OF THE DRAWINGS

FIG. 6 is a cross-sectional view of an exemplary enclosure joint.

FIG. 7 is a cross-sectional view of an exemplary enclosure joint employing a gasket according to a further embodiment of the present invention.

FIG. 8 is a cross-sectional view of an exemplary enclosure joint employing a gasket.

FIG. 9 is a cross-sectional view of the enclosure joint employed in the Examples.

DETAILED DESCRIPTION

Figure 1:
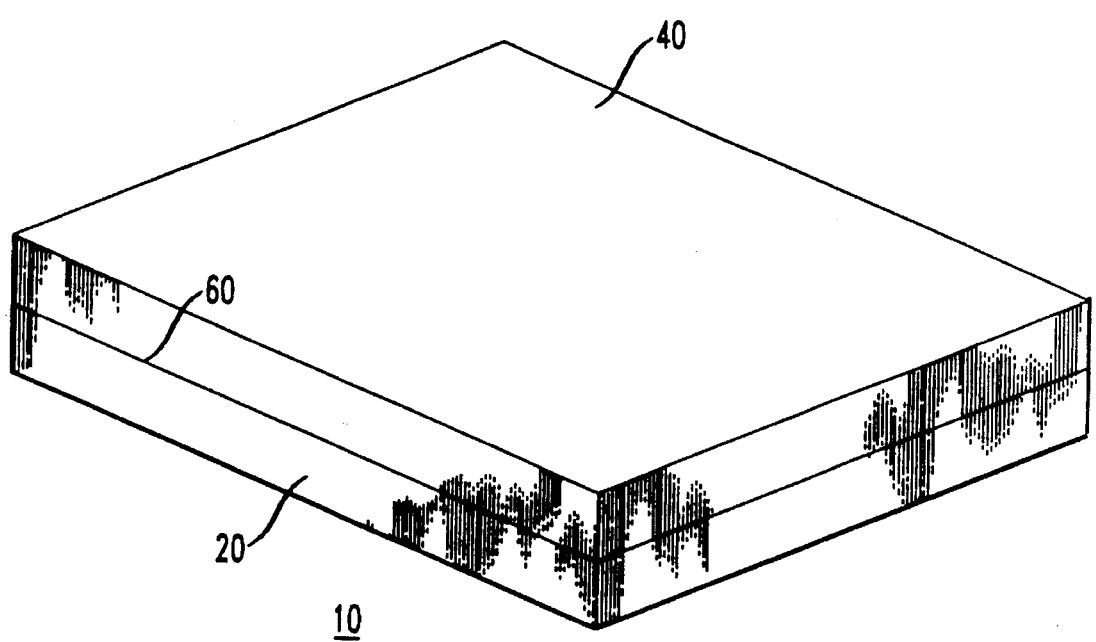
FIG. 1 is a perspective view of an EMI-shielding enclosure according to one embodiment of the present invention.

Turning now to the drawings in detail in which like numerals indicate the same or similar elements in each of the several views, FIG. 1 illustrates an EMI-shielding enclosure 10 according to a first aspect of the present invention. While the EMI-shielding enclosure 10 is illustratively depicted as a rectangular parallelepiped, it will be appreciated by those skilled in the art that enclosure 10 can be any three-dimensional geometrical shape capable of housing equipment to be shielded from electromagnetic radiation. Enclosure 10 comprises a first shielding member or portion 20 and a second shielding member or portion 40. Although the shielding members 20 and 40 are shown as halves of enclosure 10, the shielding members are selected from any shape or combination of shapes needed to comprise an enclosure. It is particularly noted that the shielding members need not be symmetrical. For example, for the rectangular box shown, shielding member 40 could comprise a planar member which engages a five-faced box-shaped member 20 to form the enclosed rectangular parallelepiped 10. Shielding members 20 and 40 are connected through joint 60.

Figure 2:
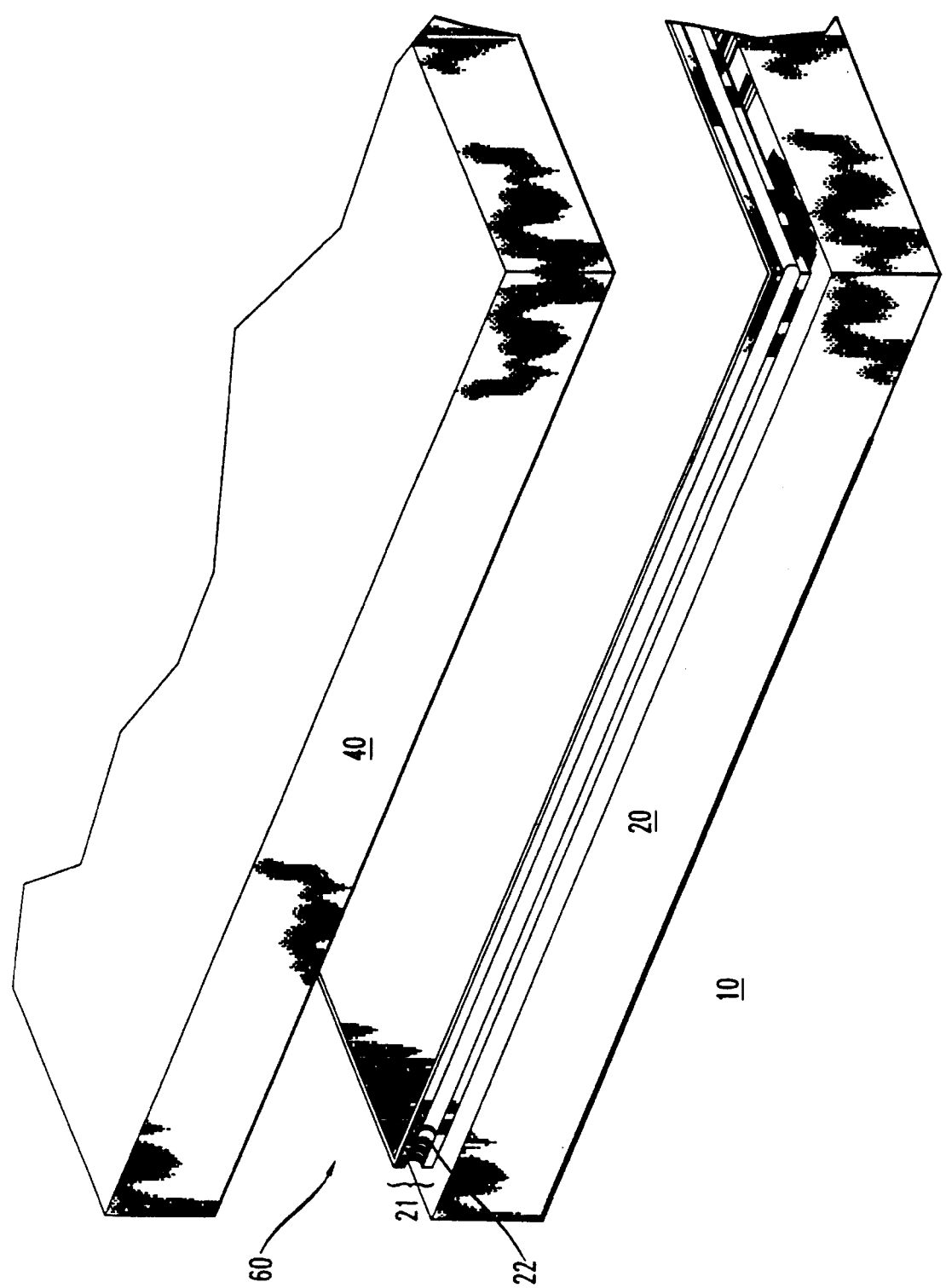
FIG. 2 is an enlarged perspective view with parts separated of the EMI-shielding enclosure of FIG. 1.
Figure 3:
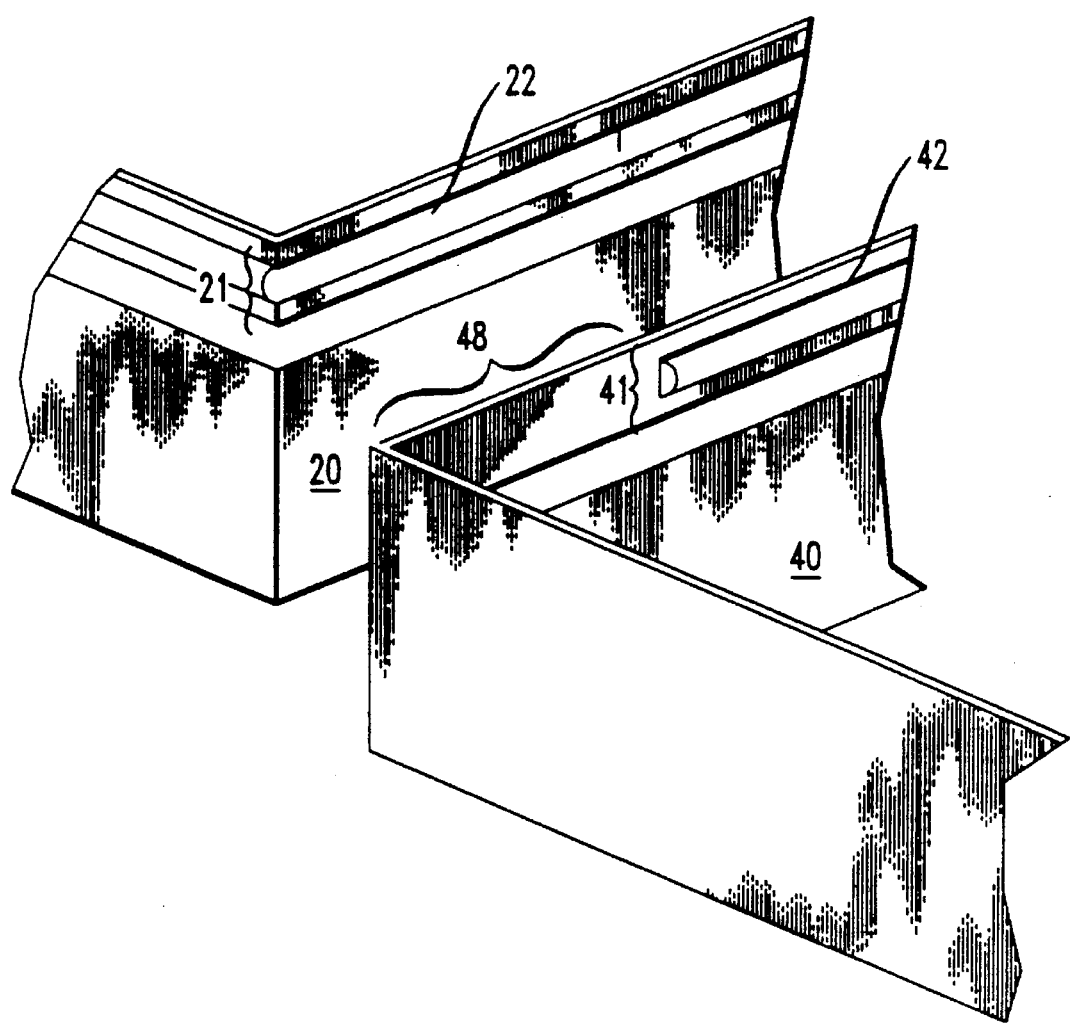
FIG. 3 is an enlarged perspective view with parts separated of the EMI-shielding enclosure of FIG. 1 illustrating the engagement surfaces of the members.

FIGS. 2 and 3 illustrate an enlarged view of the FIG. 1 shielding enclosure with shielding members 20 and 40 separated from each other. In FIG. 2, shielding member 40 is positioned above shielding member 20 prior to enclosure assembly. In FIG. 3, shielding member 40 is depicted resting on its upper surface such that its inner periphery is visible. Joint 60, separated into its component portions in FIGS. 2 and 3, comprises engagement surface 21, best seen in FIG. 2, and engagement surface 41, best seen in FIG. 3. Engagement surfaces 21 and 41 are respectively formed at the periphery of shielding members 20 and 40. As seen in FIG. 3, engagement surfaces 21 and 41 are provided with interlocking fastening elements 22 and 42 for connecting shielding members 20 and 40.

Figure 4:
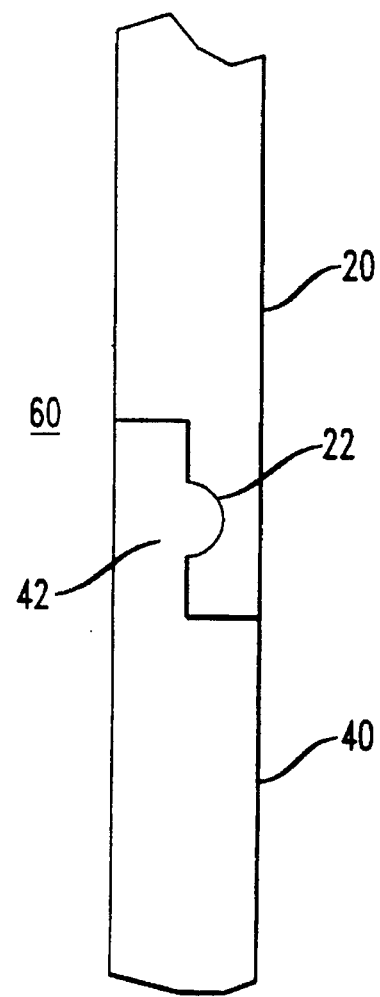
FIG. 4 is a cross-sectional view of the enclosure joint taken along line A—A in FIG. 2.

Taking a cross-sectional view along line A—A in FIG. 2, FIG. 4 illustrates the interaction of engagement surfaces 21 and 41 and interlocking fastening elements 22 and 42. In FIG. 3, each engagement surface of shielding members 20 and 40 is provided with an interlocking fastening element. Shielding member 40 includes a projecting fastening element 43, illustratively depicted as an arcuate rib 42, while shielding member 20 includes a receiving fastening element, illustratively depicted as an arcuate groove 22. Arcuate rib 42 and arcuate groove 22 are configured such that shielding members 20 and 40 are capable of "snap-fit" assembly, i.e., pressing members 20 and 40 together causes the interlocking fastening elements to engage, creating shielding enclosure 10. By providing a snap-fit assembly, the user can readily ascertain whether the unit is correctly assembled.

The use of interlocking fastening elements creates a convoluted engagement surface between the shielding members within joint 60. Since r.f. radiation is generally propagated through a line-of-sight transmission path, r.f. radiation attempting to radiate through the seal will not be able to pass through the convoluted joint. Typically, one or both of the interlocking elements will block the line-of-sight path of the propagating radiation, causing it to be attenuated or reflected. Additionally, the convoluted surface provides numerous contact points between the shielding members. When the engagement elements are seated, these contact points are sufficient to create a continuous grounding path between the two shielding members. Because of the numerous contact points, regions of discontinuity between the interlocking elements, e.g., as a result of improper seating, will not result in substantial transmission of radiation through the joint of the EMI shielding enclosure. Typically, to ensure high shielding, interengaging interlocking fastening elements are provided on at least approximately 85% of the engagement surface. However, when lower amounts of shielding are acceptable, less than 85% of the engagement surface can be provided with interlocking fastening elements.

Because of the excellent r.f. shielding provided by the convoluted engagement surface, joints can be deliberately designed to include regions which omit an interlocking fastening element on at least one of the individual shielding members. In one embodiment, discontinuities are provided in the interlocking fastening elements to produce access regions for the enclosure. A disengagement tool having a thin, planar surface can be inserted into the access regions to separate the shielding members, readily permitting inspection or removal of the housed equipment. A shielding member which includes an access region 48 is shown in FIG. 3.

Figure 5:
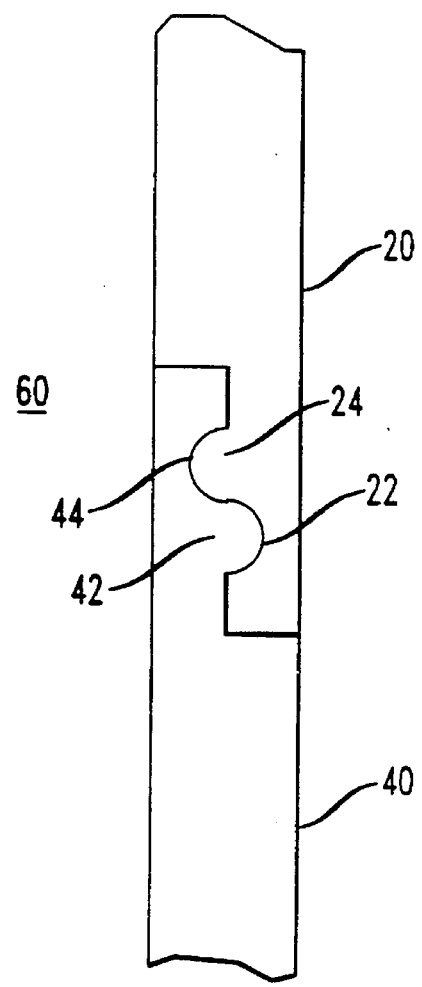
FIG. 5 is a cross-sectional view of an exemplary enclosure joint.

Joint 60 can be constructed using numerous interlocking fastening element engagement surface configurations. Further exemplary joint constructions are depicted in FIGS. 5 and 6. In FIG. 5, plural interlocking fastening elements are provided on each engagement surface of the shielding member. Shielding member 40 includes an arcuate rib 42 for engaging in arcuate groove 22 as well as an arcuate groove 44 for engaging in arcuate rib 24. In FIG. 6, shielding member 40 is provided with notch 46 for engaging with triangular cross-sectional projection 26 to create the interlocking fastening elements. While FIGS. 4–6 illustrate exemplary interlocking fastening elements, it is understood that any joint configuration is employable in the EMI shielding enclosure of the present invention which creates an interlocking engagement of shielding members 20 and 40 without the need for mechanical fastening elements, e.g., screws, rivets, bolts, etc., which are not integrally formed with at least one of the shielding members. As used herein, the expression "integrally formed" relates to parts which are formed together as a unit, whether by monolithic construction, e.g., molding or machining of fastening elements in a shielding member, or by permanently affixing a fastening element to a shielding member, e.g., by gluing an arcuate projection to an engagement surface.

For high shielding applications, joint 60 optionally includes a gasket positioned between the engagement surfaces. FIGS. 7 and 8 depict exemplary joint constructions incorporating gaskets. In FIG. 7, joint 160 is formed between shielding members 120 and 140. Shielding member 120 includes arcuate rib 122 for engagement with arcuate groove 142 of shielding member 140. Additionally, shielding member 140 is provided with arcuate groove 144 for receiving gasket 180. In the configuration of FIG. 8, both shielding members 120 and 140 are provided with arcuate grooves, 126 and 146, respectively, to accommodate gasket 180. In both embodiments, the gasket further attenuates stray radiation within convoluted joint 160 while conforming to the arcuate grooves to tightly seal the joint and provide high shielding.

Gasket 180 is selected from materials typically used for gaskets and can be formed into a variety of cross-sectional shapes, e.g., square, rectangular, and circular. Gasket materials include, but are not limited to, metals, polymers, and filled polymers. Exemplary materials are beryllium-copper and wire-reinforced rubbers.

The EMI shielding enclosures of the present inventions are made from numerous EMI-reflecting, absorbing, or combined reflecting/absorbing materials. Materials which predominantly reflect radiation include metals such as aluminum and non-conductive materials plated with metal, e.g., by vacuum metallizing or electroless deposition. Materials which predominantly absorb radiation include non-conducting materials, such as polymers, filled with conducting and/or semiconducting materials, e.g., particulate or fibrous metals, carbon, and metal-coated glass fibers. The selected material can be rigid or flexible, depending upon the desired application. Advantageously, the convoluted joint surface of the present invention provides EMI-reflecting/absorbing materials include filled polymers, as described above, coated with a layer of metal. Typically, adding a metal layer to a filled polymer increases shielding by approximately 20 dB. Selection of a particular material depends upon the required attenuation of the EMI-shielding enclosure, as well as the environmental conditions which the enclosure must endure. Typical shielding applications require at least approximately 60 dB attenuation.

Further advantages of the present invention will be evident from the following Examples:

EXAMPLE 1

The shielding effectiveness of EMI enclosure joints was tested using a dual-chamber technique. Shielding effectiveness for a joint is the measure of the joint's ability to prevent penetration of an electromagnetic field into an adjacent region of space. The dual-chamber method employs a test cell comprising two half-enclosures. A test specimen mounting plate is positioned in an aperture between the two half-enclosures. This configuration forms a test cell having two cavities separated by the mounting plate containing the joint to be measured. The periphery of the mounting plate aperture is sealed with beryllium-copper fingerstock to substantially eliminate leakage between the two cell cavities. Additionally, absorbing material is positioned on all sides of the cell cavities to prevent higher-order standing waves from interfering with measurement of the r.f. fields.

To test the shielding effectiveness of the joint affixed to the mounting plate, an r.f. is signal is generated by a network analyzer (Hewlett-Packard 8720B), amplified, and passed to the transmitting cavity by highly protected, double layer cables. The signal is conducted to an emitting dipole-conical antenna having a bandwidth from 500 MHz to 6 GHz positioned within the transmitting cavity. To measure the signal which is transmitted through the joint, an identical antenna is positioned in the other test cell cavity. The received signal is amplified and conducted to the network analyzer.

The coupling between the transmitting and receiving cavities is reduced by an amount that is the direct measurement of the shielding effectiveness of the joint affixed to the test specimen mounting plate. As such, the shielding effectiveness is defined as:

shielding effectiveness=$10 Log(P_2/P_1)$ where $P_2$ is the measured power of the received signal with the test joint inserted between the cavities; and $P_1$ is the measured power of the received signal with the aperture free of the test joint.

Following system calibration, shielding effectiveness is automatically measured by the network analyzer in units of dB according to the above relationship.

Figure 10:
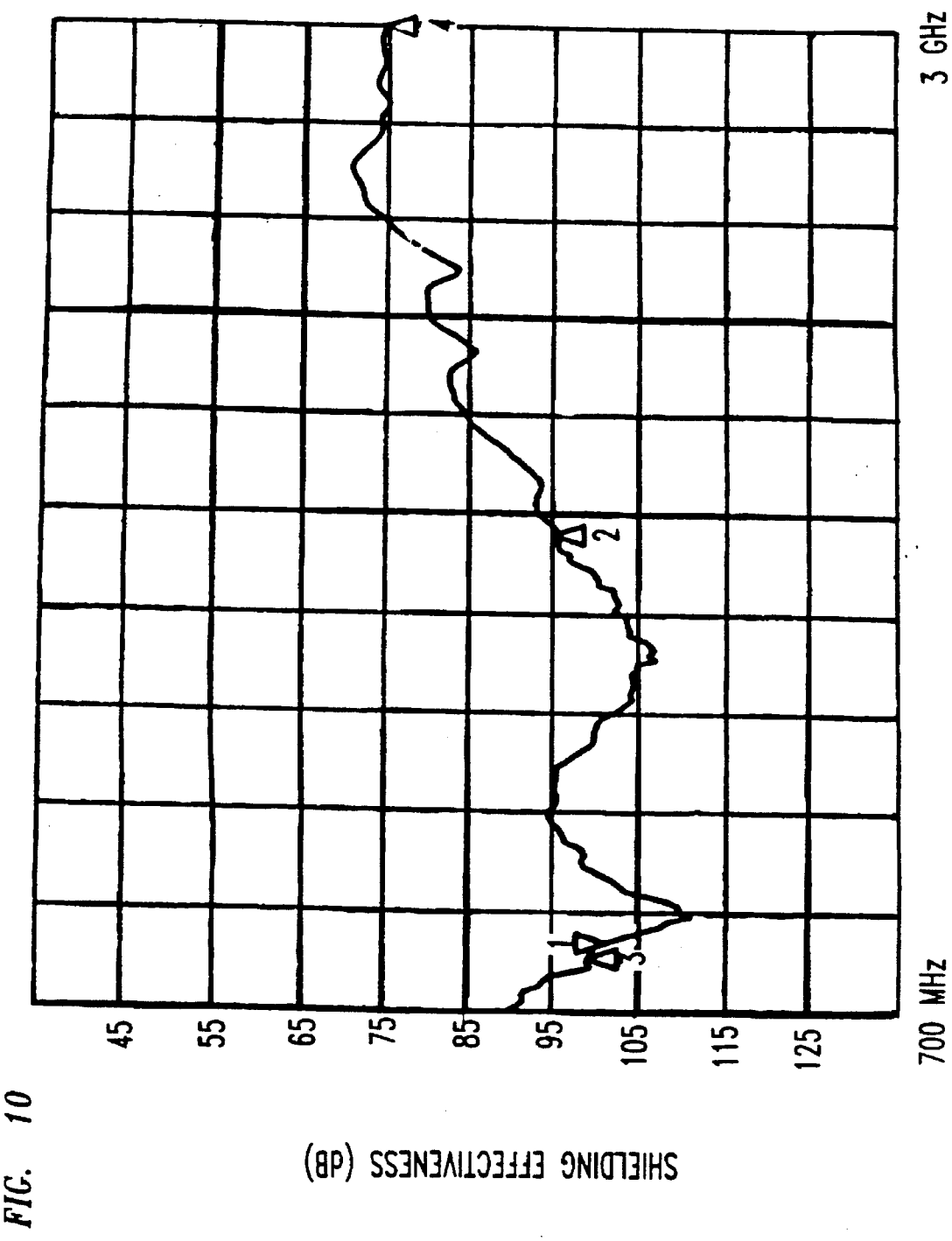
FIG. 10 is a plot of shielding effectiveness for an aluminum shielding enclosure according to the present invention.

A joint having the cross-sectional configuration of FIG. 9 was fabricated from aluminum with the dimensions of the engagement surface being: A—0.132", B—0.063", C—0.125", D—0.050", and R—0.024" was affixed to the specimen mounting plate with screws. The shielding effectiveness of the joint was measured according to the above procedure in the frequency range of 700–3000 MHz. The results are shown in FIG. 10. As seen in FIG. 10, the aluminum joint shows excellent shielding, typically greater than 75 dB, across the entire frequency range. Sample points 1–4 indicate shielding effectiveness at various frequencies of interest. For each of these points, shielding effectiveness is high. For frequencies typically used in telecommunications applications, shielding of greater than 95 dB is attained.

EXAMPLE 2

Figure 11:
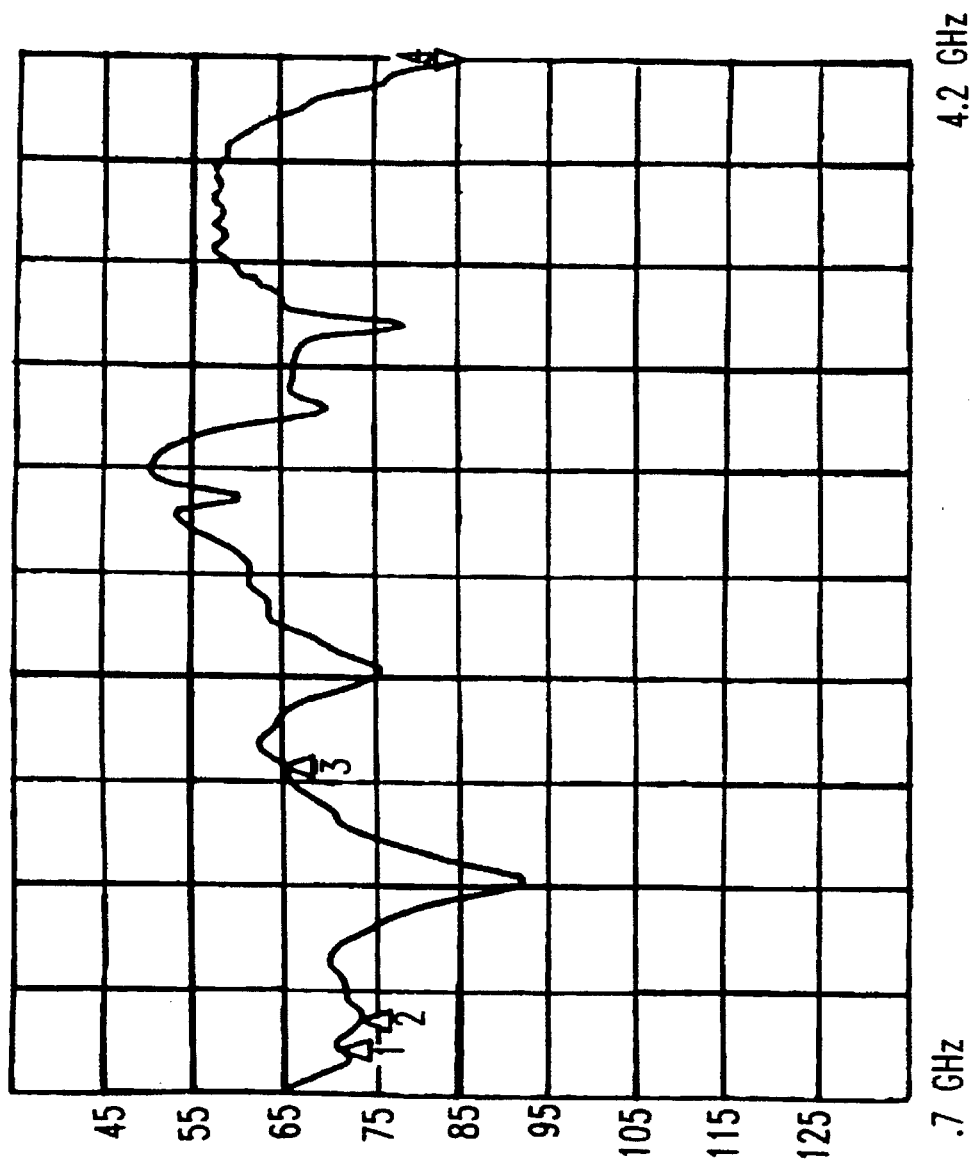
FIG. 11 is a plot of shielding effectiveness for a polycarbonate shielding enclosure loaded with nickel-coated glass fibers according to the present invention.

An enclosure joint having the dimensions of Example 1 was fabricated from polycarbonate filled with nickel-coated glass fibers. The shielding effectiveness was measured in the frequency range of 700–4200 MHz according to the above procedure. The shielding effectiveness is plotted in FIG. 11. As seen in FIG. 11, good shielding is demonstrated across the frequency range.

EXAMPLE 3

Figure 12:
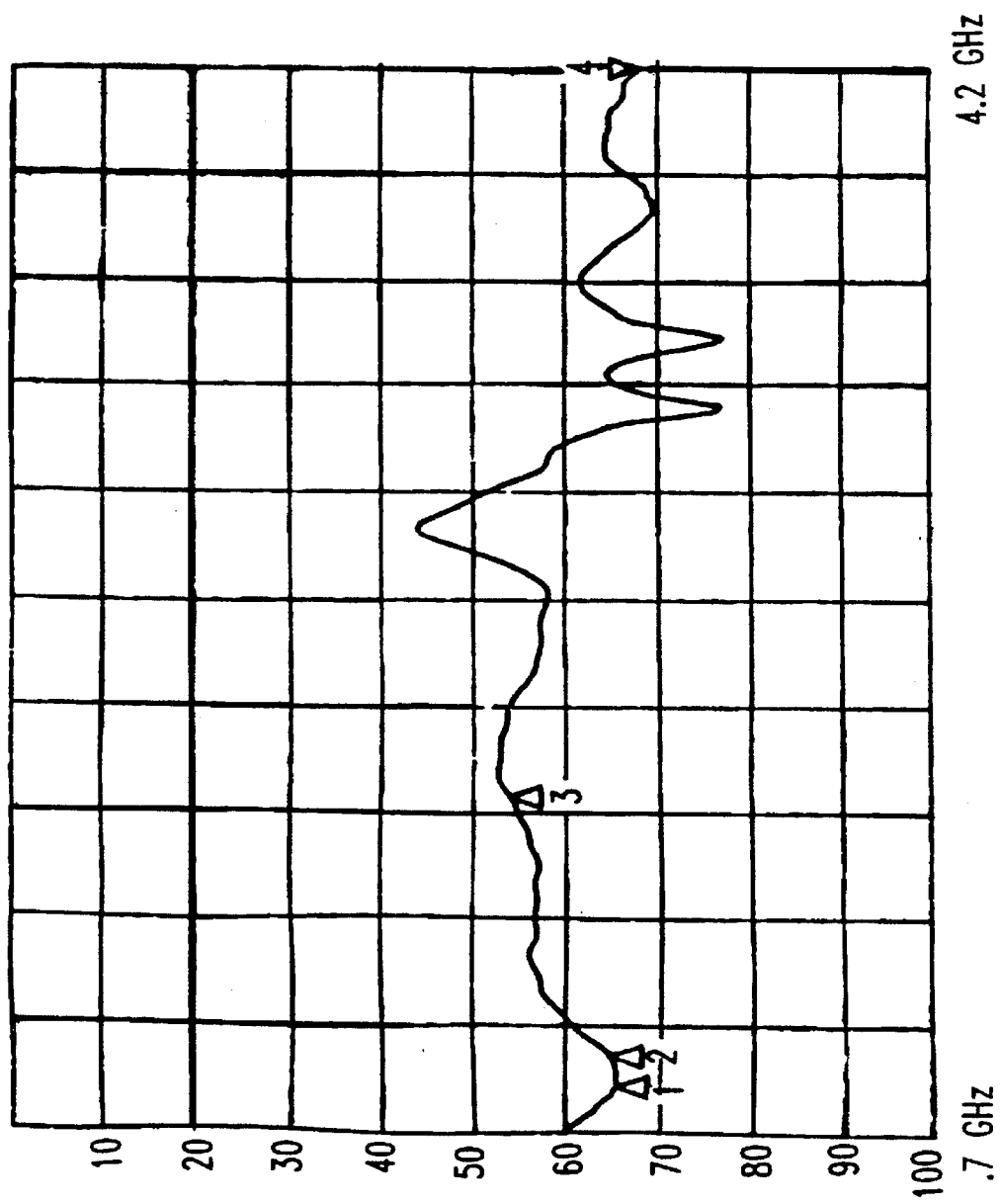
FIG. 12 is a plot of shielding effectiveness for a stainless steel fiber-reinforced polycarbonate shielding enclosure according to the present invention.

An enclosure joint having the dimensions of Example 1 was fabricated from polycarbonate filled with 25% stainless steel fibers. The shielding effectiveness was measured in the frequency range of 700–4200 MHz. The shielding effectiveness is plotted in FIG. 12. Again, good shielding is demonstrated by the joint.

The shielding enclosures of the present invention are employed in numerous applications. The shielding enclosures are employed in cellular communications systems to house r.f. equipment, typically located at the cellular system base station. Exemplary equipment to be shielded includes radio transmitters, radio receivers, and amplifiers. The shielding enclosures of the present invention also find application in housing electrical devices which are sensitive to extraneous r.f. fields, including r.f. fields which have a time-varying average power level. Such electrical devices include, but are not limited to, computers, computer peripherals, medical equipment, stereo equipment, aircraft electrical components, motor vehicle ignition and timing systems, and circuit elements for control systems.

While the foregoing invention has been described in terms of the above embodiments, numerous modifications can be made. It is understood that any shielding member and joint geometry which forms an EMI shielding enclosure without the need for additional mechanical fastening elements can be employed in the self-fastening EMI shielding enclosures of the present invention. Additionally, more than two shielding members can be used to construct an EMI-shielding enclosure. Accordingly, modifications such as those suggested above, but not limited thereto, are to be considered within the scope of the appended claims.

What is claimed is:

1. In an enclosure for protecting electrical equipment from electromagnetic interference, the enclosure having at least first and second EMI-shielding portions housing a piece of electrical equipment to be shielded, the improvement comprising:

providing the first EMI-shielding portion of the module with a first self-fastening interlocking element on a first vertical engagement surface, the first self-fastening interlocking element being integrally formed with the first EMI-shielding portion on at least approximately 85% of the first engagement surface;

providing the second EMI-shielding portion of the module with a second self-fastening interlocking element on a second vertical engagement surface, the second self-fastening interlocking element being integrally formed with the second EMI-shielding portion of the module on at least approximately 85% of the second engagment surface, the first and second self-fastening interlocking elements connecting the first and second EMI-shielding portions of the module at the vertical engagement surfaces without mechanical fastening elements which are not integrally formed with at least one portion such that electromagnetic energy is not transmitted through the connected first and second interlocking elements at a substantially greater rate than through the remaining portions of the module.

2. An enclosure for protecting electrical equipment according to claim 1 wherein the first and second shielding portions are fabricated from a material comprising aluminum.

3. An enclosure for protecting electrical equipment according to claim 1 wherein the first and second shielding portions are fabricated from a polymeric material.

4. An enclosure for protecting electrical equipment according to claim 3 wherein the polymeric material includes a filler selected from particulate metals, fibrous metals, carbon, and metal-coated glass fibers.

5. An enclosure for protecting electrical equipment according to claim 1 wherein the first interlocking element includes an arcuate rib and the second interlocking element includes an arcuate groove.

6. An enclosure for protecting electrical equipment according to claim 1 wherein at least one of the EMI-shielding portions includes a region configured to accommodate a gasket.

7. An enclosure for protecting electrical equipment according to claim 1 wherein the electrical equipment is selected from radio transmitters, radio receivers, amplifiers, computers, computer peripherals, medical equipment, stereo equipment, aircraft electrical components, motor vehicle ignition and timing systems, and circuit elements for control systems.

8. An enclosure for protecting electrical equipment from electromagnetic interference, comprising:
  a first EMI-shielding member having a first peripheral vertical edge, the first peripheral edge having a first self-fastening element integrally formed with the peripheral edge on at least approximately 85% of the edge;
  a second EMI-shielding member having a receiving element on a second vertical peripheral edge configured to removably receive the first self-fastening element of the first peripheral edge, the first self-fastening element and the receiving element configured such that the first and second EMI-shielding members form an enclosure when the first self-fastening element is engaged in the receiving element without mechanical fastening elements which are not integrally formed with at least one member.

9. An enclosure for protecting electrical equipment according to claim 8 wherein the first and second EMI-shielding members are fabricated from a material comprising aluminum.

10. An enclosure for protecting electrical equipment according to claim 8 wherein the first and second EMI-shielding members are fabricated from a polymeric material.

11. An enclosure for protecting electrical equipment according to claim 10 wherein the polymeric material includes a filler selected from particulate metals, fibrous metals, carbon, and metal-coated glass fibers.

12. An enclosure for protecting electrical equipment according to claim 8 wherein the first fastening element includes an arcuate rib and the receiving element includes an arcuate groove.

13. An enclosure for protecting electrical equipment according to claim 8 wherein at least one of the EMI-shielding members includes a region configured to accommodate a gasket.

14. An enclosure for protecting electrical equipment according to claim 8 wherein the first EMI-shielding member includes a second self-fastening element integrally formed with the first shielding member and the second EMI-shielding member includes a second receiving element integrally formed with the second EMI-shielding member.

15. An enclosure according to claims 1 or 8 wherein the enclosure provides shielding for electromagnetic radiation at a frequency of at least 0.7 GHz.

16. An enclosure according to claim 15 wherein the enclosure exhibits a shielding effectiveness of at least 60 dB for electromagnetic radiation over at least some frequency range above 0.7 GHz.

* * * * *